United States Patent [19]

Feuerbaum et al.

[11] Patent Number: 4,675,602

[45] Date of Patent: Jun. 23, 1987

[54] METHOD FOR AUTOMATICALLY SETTING AN OPERATING POINT GIVEN SIGNAL CURVE MEASUREMENTS WITH A PARTICLE BEAM MEASURING APPARATUS

[75] Inventors: Hans-Peter Feuerbaum; Peter Fazekas, both of Munich, Fed. Rep. of Germany

[73] Assignee: Siemens Aktiengesellschaft, Berlin and Munich, Fed. Rep. of Germany

[21] Appl. No.: 706,105

[22] Filed: Feb. 27, 1985

[30] Foreign Application Priority Data

Feb. 27, 1984 [DE] Fed. Rep. of Germany ....... 3407041

[51] Int. Cl.[4] .......................................... G01N 23/225
[52] U.S. Cl. ................................ 324/158 R; 250/311; 324/73 R
[58] Field of Search ................. 324/73 R, 71.4, 73 R, 324/158 D, 158 R, 409; 250/307, 310, 397, 311

[56] References Cited

U.S. PATENT DOCUMENTS

| 4,220,853 | 9/1980 | Feuerbaum et al. | 250/310 |
|---|---|---|---|
| 4,220,854 | 9/1980 | Feuerbaum | 250/310 |
| 4,227,679 | 7/1981 | Feuerbaum | 250/310 |
| 4,486,660 | 12/1984 | Feuerbaum | 324/158 R |
| 4,531,057 | 7/1985 | Kobayashi | 250/397 |
| 4,538,065 | 8/1985 | Miyoshi et al. | 324/158 R |
| 4,539,477 | 9/1985 | Feuerbaum et al. | 324/158 R |
| 4,581,534 | 4/1986 | Tokodoro et al. | 324/158 D |

FOREIGN PATENT DOCUMENTS 3235484  3/1984  Fed. Rep. of Germany .
2017940 10/1979  United Kingdom ............ 324/158 R

OTHER PUBLICATIONS

"VLSI Testing Using The Electron Probe38, by Feuerbaum, 1979, Scanning Electron Microscopy, vol. 1, pp. 285-296.

"Phase Control with Digital Delay for Circuit Tester Using Electron-Beam Switching", by Herman et al., IBM Tech. Disc. Bull., 8/75, vol. 18, #3, pp. 870-871.

Solid-State Electronics, 1972, vol. 15, pp. 987-992, "Potential Measurement And Stabilization Of An Isolated Target Using Electron Beams", by P. E. Kudiraka et al.

IEEE Trans. on Electron Devices, vol. ED-26, No. 4, (1979-04), pp. 549-559, "Electron-Beam Testing Of VLSI Circuits", by Eckhard Wolfgang et al.

Primary Examiner—Reinhard J. Eisenzopf
Assistant Examiner—W. Burns
Attorney, Agent, or Firm—Hill, Van Santen, Steadman & Simpson

[57] ABSTRACT

A method for automatically setting an operating point in signal curve measurements with particle beam measuring apparatus. An automatic setting of the operating point is provided when no specific point in time is known at which a reference potential is present at a measuring location. Given stroboscopically keyed primary particles, a periodic signal curve, which also comprises a specific reference potential in addition to other potentials, is applied to the measuring location. The keying phase of the keyed primary particles is varied with respect to the periodic signal curve. The periodic signal curve is quantitatively registered in this fashion. The phase point of the qualitatively registered signal curve which corresponds to the specific reference potential at the measuring location is identified. A keying phase of the primary particles is kept constant during the setting of the operating point, and is kept constant to phase points at which the reference potential is present at the measuring location.

6 Claims, 1 Drawing Figure

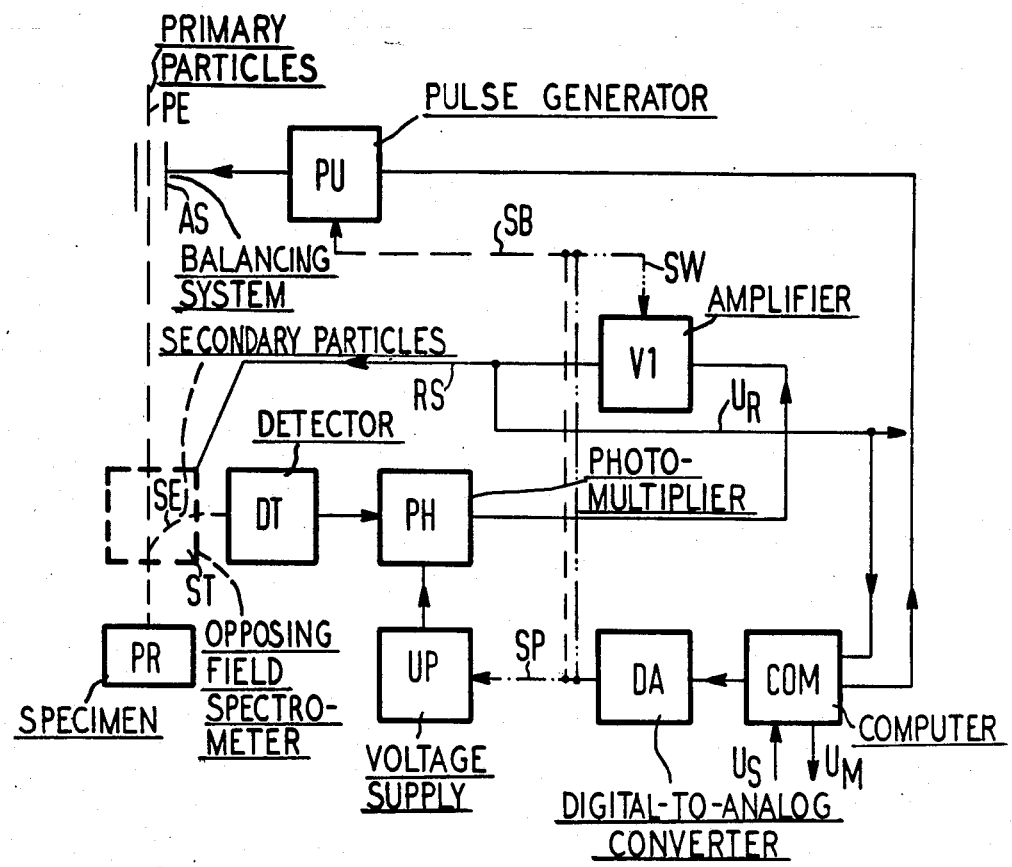

METHOD FOR AUTOMATICALLY SETTING AN OPERATING POINT GIVEN SIGNAL CURVE MEASUREMENTS WITH A PARTICLE BEAM MEASURING APPARATUS

BACKGROUND OF THE INVENTION

The invention relates to a method for automatically setting an operating point given signal curve measurements with a particle beam measuring apparatus in which primary particles impinge on a measuring location and an energy shift of secondary particles is triggered at the measuring location and is measured with an opposing field spectrometer. An opposing field of the opposing field spectrometer is set via a feedback circuit to a predetermined rated value for a specific reference potential at a measuring location.

Signal curve measurement with an electron beam measuring apparatus is based on the measurement of the energy shift of the secondary electrons with an opposing field spectrometer. Such a measurement of periodic signal curves with an opposing field spectrometer is disclosed, for example, in U.S. Pat. No. 4,220,853, incorporated herein by reference. Relative to a specific reference potential, the opposing field of the spectrometer is set to a predetermined value dependent on the respective distribution of the secondary electrons. Insofar as possible, this operating point should lie at the steepest location of that curve which describes the distribution of the secondary electrons. Such a setting of the operating point enables a high measuring precision. The distribution of the secondary electrons depends, among other things, on the material of which the measuring point is composed. The barrier of the opposing field spectrometer is usually set to a value between −6 V through −8 V with reference to ground potential. The setting of the barrier of the opposing field spectrometer occurs in a known feedback circuit (U.S. Pat. No. 4,277,679, incorporated herein by reference) by varying the gain of the secondary electron signal. Given the known method of the '679 patent, the measuring point for setting the barrier of the opposing field spectrometer is applied to ground potential and the gain of the secondary electron signal is then set via a variation of the voltage of a photomultiplier employed in the known feedback circuit. A method for setting the operating point according to U.S. Pat. No. 4,277,679 requires a changeover switch with which switching back and forth between a reference voltage and an operating voltage can be carried out, depending upon whether a setting of the operating point or a potential measurement is to be undertaken at the moment.

Given a method known from U.S. Pat. No. 4,220,854, incorporated herein by reference, for measuring the potential curve in an electronic component, the signal of a constant reference phase is measured together with and during the continuous sensing of a signal curve. The difference between the measured signal and the reference signal is thus free of drift, whereby both the measured signal as well as the reference signal respectively have drift phenomena in and of themselves, due to contamination at the measuring point.

A method for measuring signal curves is known from the German Patent Application No. P 32 35 484, incorporated herein by reference, wherein a known reference voltage is measured at a measuring location at at least one point in time for the suppression of disturbances in the signal curve, and wherein a secondary electron signal which results from a measurement of such a reference voltage then controls the operating point of a feedback circuit for the suppression of the disturbance.

All of the cited, known methods presume that the point in time at which a specific reference voltage is present at a measuring location is known. There is no indication in any of the cited publications as to how an operating point of a feedback circuit, given an electron beam measuring apparatus, can also be set when no single point in time at which a specific reference potential is present at a measuring point is known.

SUMMARY OF THE INVENTION

An object of the present invention is to specify a method of the type initially cited with which an automatic setting of the operating point is possible when no specific point in time at which a specific reference potential is present at a measuring location is known.

This object is achieved according to the invention as follows. Given stroboscopically keyed primary particles, a periodic signal curve is applied to the measuring location. The periodic signal curve also has a defined reference potential in addition to other potentials. The keying phase of said keyed primary particles is varied with respect to the periodic signal curve. The periodic signal curve ($U_R$) is entirely or partially qualitatively registered in this fashion. A phase point of the qualitatively registered signal curve $U_R$ which corresponds to the defined reference potential at said measuring location is determined. The keying phase of the keyed primary particles is set to such a phase point of the periodic signal curve wherein said defined reference potential is present at said measuring location. During setting of the operating point, the keying phase is kept at such phase points so that the reference potential is present at the measuring location.

According to the invention, a specific point in time at which a measuring location has a specific reference potential is first determined, given stroboscopic operation of an electron beam measuring apparatus. A computer controls the keying phase at which the primary electrons are keyed in with respect to the periodic signal curve at the measuring location, and qualitatively registers the signal curve thus determined in rough steps. The step size between different keying phases is thus selected such that no signal change can be "overlooked". In order to achieve this, the step size between different keying phases must be adapted to the sensed time range of the signal curve.

Given logic circuits, the periodic signal curve generally has only two different potentials.

Both the minimum as well as the maximum of a qualitatively registered signal curve can be employed for the determination of such points in time at which a measuring location lies at a specific potential. Given logic circuits, the minimum of the qualitatively registered signal curve thus corresponds to such phase points of the periodic signal curve at which the measuring location lies at ground potential. The keying phase of the primary electrons is set to such a phase point with respect to the periodic signal curve at the measuring location with the assistance of a computer, and is held constant during the setting of the operating point.

The maximum of a signal curve registered given logic circuits indicates such phase points at which the measuring location is at a reference potential, such as corresponds to logical "1". When the grounded potential is used as the reference potential at the measuring location, then the barrier of the opposing field spectrometer should lie between −6 V and −8 V. When a different potential is employed as the reference potential at the measuring location, the rated value for the barrier of the opposing field spectrometer must be correspondingly corrected.

Given measuring locations which can have more than two possible reference potentials, at which, for example, an arbitrary ac signal is adjacent, not only a maximum and minimum of the registered signal curve can be employed as possible reference potentials, but also the minimum plus a fraction of the difference between maximum and minimum of the signal curve can be utilized.

The automatic setting of the operating point of the feedback circuit can be effected by varying the gain factor of an amplifier following the detector. When the detector is followed by a photomultiplier, the gain of the secondary electron signal is preferably controlled via an adjustment of the photomultiplier voltage. The variation in the gain factor of an amplifier can be controlled by a computer via a digital-to-analog converter. The variation of the gain factor of an amplifier or the photomultiplier voltage is preferably set in an interval halving method such that the difference between the measured signal which corresponds to a specific reference potential and the operating point likewise corresponding to this reference potential becomes minimal. For example, such setting of the operating point can already have occurred after ten iterative steps. The operating point actually set in the feedback circuit is measured and is employed as a correction value for the measured signal during the measurement of the signal curve.

BRIEF DESCRIPTION OF THE DRAWINGS

The drawing figure shows an arrangement for the implementation of a method according to the invention.

DESCRIPTION OF THE PREFERRED EMBODIMENTS

Primary electrons PE impinge a measuring location on the specimen PR and trigger secondary electrons SE. These secondary electrons SE have a specific secondary electron distribution. This secondary electron distribution undergoes a shift with respect to the energy dependent on the potential at the measuring location of the specimen PR without the shape of the secondary electron distribution being thus substantially altered. When the opposing field of the opposing field spectrometer ST is varied analogous to the change of the potential at the measuring location of the specimen PR, then the number of those secondary electrons SE which are capable of passing the respective opposing field of the opposing field spectrometer ST in the direction toward the detector DT can be kept constant. Given a specific reference potential at the measuring location of the specimen PR, the number of those secondary electrons SE that can pass the opposing field spectrometer ST in the direction toward the detector can be set by setting a specific opposing field in the opposing field spectrometer, and can then be kept constant with the assistance of the feedback circuit RS for all other potentials at the measuring location of the specimen PR. When the secondary electron distribution is considered as a function of the energy, then a point which corresponds to the operating point of the opposing field spectrometer ST is usually defined at the steepest location of the curve which represents this secondary electron distribution. All secondary electrons SE whose energy is higher than this point at the steepest location of the curve of the secondary electron distribution proceed to the detector DT. All secondary electrons SE whose energy is lower than that energy which corresponds to the point at the steepest location of the secondary electron distribution curve cannot overcome the barrier of the opposing field spectrometer ST and cannot proceed to the detector DT. A setting of the operating point in the form just described enables a high measuring precision. The barrier of the spectrometer usually lies between −6 V and −8 V, assuming a ground potential is applied as a reference potential at the measuring location of the specimen PR.

The secondary electrons SE documented by the detector DT create a secondary electron measured signal at the output of the photomultiplier PH connected to the detector DT, this measured signal being amplified in an amplifier V1. The measured signal $U_R$ appears at the output of the amplifier V1. This measured signal $U_R$ corresponds on the one hand, to that voltage which is applied to the opposing field electrode of the opposing field spectrometer ST. On the other hand, the measured signal $U_R$ proceeds to a computer COM and can be compared there to a prescribed rated value $U_S$. The computer COM controls the keying phases at which the pulse generator PU communicates keying signals to the blanking system AS for the primary electrons PE. Via a digital-to-analog converter DA as well as via a line SP, the computer COM can control the voltage of the photomultiplier PH as well as, via a line SW, the gain factor of an amplifier V1 or, via a line SB, the pulse width of the primary electrons PE via the pulse generator PU and via the beam blanking system AS. The control of the gain of the photomultiplier PH thus occurs such that the voltage supply UP of the photomultiplier PH is driven so that the voltage of the photomultiplier PH assumes a value such that the secondary electron measured signal $U_R$ measured for a reference potential coincides with the rated value $U_S$ for this measured signal.

For implementing the method of the invention, a periodic potential signal curve is applied to the specimen PR at the measuring location. In order to be able to locate a phase point within this periodic signal curve at which a reference potential is present at the measuring location of the specimen PR, the measuring arrangement is stroboscopically operated. Accordingly, the primary electrons PE are keyed by the pulse generator PU via the blanking system AS such that primary electrons PE impinge the measuring location per period of the periodic signal curve at the measuring location of the specimen PR only at respective, very specific times of the periodic signal curve. The computer COM controls the keying phase of the primary electrons PE and, dependent on time, varies this keying phase with respect to the periodic signal curve at the measuring location. At the same time, the computer COM qualitatively registers the signal curve of the measured signal $U_R$ in rough steps. The step size between different keying phases is thus selected such that no signal change can be "overlooked" within the periodic signal curve at the measuring location. For this purpose, the step size between different keying phases is adapted to the sensed time range of the periodic signal curve. Given logic circuits, the periodic signal curve only has fluctuations between a minimum value and a maximum value. Given logic circuits, the minimum of the periodic signal curve preferably indicates such phase points of the periodic signal curve at which the measuring location is at ground potential. The computer COM sets the keying phase to such a phase point, and the keying phase is kept constant during the setting of the operating point in the stroboscopic mode.

Given automatic setting of the operating point, the amplification of the secondary electron signal is preferably regulated via a setting of the photomultiplier voltage. This setting of the photomultiplier voltage is controlled by the computer COM, and preferably via a 10 bit digital-to-analog converter DA. The photomultiplier voltage is preferably set in an interval halving method such that the difference between the measured signal $U_R$ corresponding to a reference potential at the measuring location and the rated value $U_S$ corresponding to this reference potential at the measuring location becomes minimum. The minimization of this difference between measured signal $U_R$ and rated value $U_S$ can occur, for example, in ten iterative steps given the interval halving method. The operating point of the feedback circuit RS that is actually set is represented by that measured signal $U_R$ which is measured for the selected reference potential at the measuring location. This actually set operating point is employed as a correction value during the partial or entire measurement of a period of the signal curve at the measuring location. Finally, a measured signal curve $U_M$ which corresponds to the difference between the measured signal $U_R$ for various potentials at the measuring location and the operating point can be output by the computer COM onto a picture screen or onto some other output device.

The measurement of a potential curve at a measuring location is considerably simplified by the invention because, in contrast to the prior art, a phase point at which a specific reference potential is present at a measuring location is determined by the electron beam measuring apparatus itself. Given the prior art, information about the phase point of a signal curve at which a specific reference potential is present at a measuring location had to be input into an executive sequencer. Alternatively, a reference voltage could be applied to a measuring location according to the prior art via a changeover switch independently of a periodic signal curve. An additional changeover switch and an additional reference voltage source were, however, required for this purpose.

In any event, the invention facilitates the manipulation of the quantitative measurement of a periodic signal curve and considerably simplifies the arrangement given an electron beam measuring apparatus. Moreover, a quantitative potential measurement can be executed considerably faster and supplies better measured results than possible given the prior art, due to the digital processing of the measured results in the computer COM.

Any desktop computer, for example a computer of the BASIS Company, type 108, can be employed as the computer COM. All commercially available devices can be employed as the digital-to-analog converter. An interval halving method may be found in any manual for numerical mathematics. The location of a minimum or of a maximum can likewise be enabled with very simple numerical mathematics methods.

A method of the invention also supplies better results than possible with the prior art because the measured signal $U_R$ itself, and not some output signal of an intermediate amplifier, is employed for the regulation of the photomultiplier voltage, for the gain factor of the amplifier V1, or for the pulse width of the primary electrons PE.

The method of the invention is applicable not only given an electron beam measuring apparatus but, in more general terms, also given an ion beam measuring apparatus or, in even more general terms, given a particle beam measuring apparatus.

A feedback circuit for the implementation of a method of the invention can also be designed such that the secondary electron signal following the photomultiplier PH is amplified in a first amplifier, that it is then compared in a computer to a rated value, that the difference between the secondary electron signal amplified in the first amplifier and the rated value prescribed in the computer is supplied to a second amplifier, and that the output signal of this second amplifier serves both as a measured signal as well as a potential for the opposing field electrode of the opposing field spectrometer ST. Given such a design of the feedback loop RS, a digital-to-analog converter DA is driven by the computer with the difference between the secondary electron signal amplified in the first amplifier and the rated value prescribed for this signal. The operating point can then be set via this digital-to-analog converter in exactly the same fashion as in the embodiment described with reference to the drawing figure.

An ion beam apparatus can also be employed in corresponding fashion instead of an electron beam apparatus.

In an alternative measuring arrangement, the output signal of the photomultiplier PH can be supplied to an analog-to-digital converter. The digital output signal of this analog-to-digital converter is respectively compared to the contents of a maximum value register and-/or a minimum value register by a maximum value comparator or a minimum value comparator, and the contents of the corresponding registers are renewed under given conditions after every measured signal which corresponds to a specific phase point of the periodic signal curve at the measuring location of the specimen PR. Stated more precisely, when the value of the measured signal is greater than the value specified in the maximum value register, the content of the maximum value register is newly written and is then retained as a peak value in the positive direction. With respect to the minimum values, it is true that, when the value of the measured signal is smaller than the value specified in the minimum value register, the minimum value register is newly written in order to renew or update the peak value in a negative direction. At the end of the measurement, the values residing in the maximum value register and in the minimum value register are combined with one another to provide the reference value by use of logic elements in accordance with how the reference potential is provided as a function of the maximum value and/or minimum value of the periodic signal curve at the measuring location of the specimen PR. For example, the reference potential can be assigned to only the minimum value or to only the maximum value, or to the minimum value plus a fraction of the difference between the maximum value and the minimum value.

The corresponding phase point of the periodic signal curve can be specified at the same time as the identification of the maximum value or minimum value of the periodic voltage curve when: (1) The reference potential has been allocated either to the maximum value or the minimum value of the periodic voltage curve; (2) When information regarding which phase point of the periodic signal curve is allocated to the new content of the maximum value register or minimum value register has been deposited in some register (memory element) simultaneously with the respective updating of the contents of the maximum value register and/or minimum value register. With this procedure, the keying phase of the primary particles can be very easily set to the corresponding phase point of the corresponding signal curve, and thus the operating point of the feedback circuit RS can be set to this phase point as shown in the drawing.

When, for example, the reference potential has been assigned to a sum of the minimum value plus a fraction of the difference of the maximum value and minimum value, then the minimum value and maximum value of the periodic voltage curve must be determined first. Thus the exact digital value for the sum of the identified minimum value plus the prescribed fraction of the difference between the identified maximum value and the identified minimum value must be determined. This value is determined last and is to have the reference potential allocated to it. It is then input into a register (comparator). In a further measurement, a measured signal and the corresponding phase point of the periodic signal curve to which the reference potential is allocated must be determined, for example by a comparator circuit. When finally the keying phase of the primary particles has been set to the phase point of the periodic signal curve which has been identified in this fashion, then the operating point of the feedback circuit RS can be set.

Although various minor changes and modifications might be proposed by those skilled in the art, it will be understood that we wish to include within the claims of the patent warranted hereon all such changes and modifications as reasonably come within our contribution to the art.

We claim as our invention:

1. In a method for automatically setting an operating point given signal curve measurements with a particle beam measuring apparatus wherein primary particles impinge on a measuring location, an energy shift of secondary particle being triggered at the measuring location and being measured with an opposing field spectrometer, and an opposing field of the opposing field spectrometer being set via a feedback circuit to a predetermined rated value for a specific reference potential at said measuring location, wherein an improvement comprises the steps of:

prior to measurement of time-dependency of signals on the specimen (a) applying a periodic signal curve to said measuring location given stroboscopically keyed primary particles, said periodic signal curve also having a defined reference potential in addition to other potentials;

(b) varying a keying phase of said keyed primary particles with respect to said periodic signal curve;

(c) at least partially qualitatively registering the periodic signal curve;

(d) determining a phase point of the qualitatively registered signal curve which corresponds to said defined reference pontential at said measuring location;

(e) setting said keying phase of said keyed primary particles to a phase point of said periodic signal curve wherein said defined reference pontential is present at said measuring location; and (f) during setting of said operating point, keeping this keying phase at such phase points so that said reference pontential is present at said measuring location.

2. A method according to claim 1 including the step of setting a gain factor of an amplifier with assistance from a computer in order to set the operating point.

3. A method according to claim 2 including the step of setting a voltage of a photomultiplier which also serves as a preamplifier.

4. A method according to claim 1 including the step of setting a pulse width of said primary particles for setting said operating point.

5. A method according to claim 1 including the step of setting said operating point via a digital-to-analog converter.

6. A method according to claim 1 including the step of setting said operating point with assistance from an interval halving method so that, with respect to said reference potential, a difference between a measured signal at said measuring location and said rated value prescribed for said opposing field of said opposing field spectrometer becomes a minimum.

* * * * *